United States Patent [19]
Baumann

[11] Patent Number: 5,744,992
[45] Date of Patent: Apr. 28, 1998

[54] DIGITAL PHASE SHIFTER

[75] Inventor: Douglas D. Baumann, San Jose, Calif.

[73] Assignee: VLSI Technology, Inc., San Jose, Calif.

[21] Appl. No.: 823,591

[22] Filed: Mar. 25, 1997

Related U.S. Application Data

[62] Division of Ser. No. 575,766, Dec. 20, 1995.

[51] Int. Cl.$^6$ ...................................................... H03K 5/135
[52] U.S. Cl. .......................... 327/241; 327/279; 327/261;
327/265
[58] Field of Search ................................ 377/64, 73, 43;
327/232, 237, 238, 241, 250, 254, 255,
256, 261, 265, 273, 279, 286, 276

[56] References Cited

U.S. PATENT DOCUMENTS

| | | | |
|---|---|---|---|
| 3,781,706 | 12/1973 | Osborne et al. | 327/241 |
| 4,400,666 | 8/1983 | Sekiguchi | 327/279 |
| 4,484,154 | 11/1984 | Pavin | 327/232 |
| 4,516,861 | 5/1985 | Frew et al. | 327/286 |
| 4,672,639 | 6/1987 | Tanabe et al. | 327/273 |
| 5,128,624 | 7/1992 | Hoshino et al. | 377/43 |
| 5,221,863 | 6/1993 | Motegi | 327/250 |
| 5,534,808 | 7/1996 | Takaki et al. | 327/231 |

FOREIGN PATENT DOCUMENTS

61-206309  9/1986  Japan ................................ 327/265

*Primary Examiner*—Timothy P. Callahan
*Assistant Examiner*—Eunja Shin
*Attorney, Agent, or Firm*—Douglas L. Weller

[57] ABSTRACT

A digital phase shifter phase shifts an input signal by a predetermined phase angle. A length of a cycle of the input signal is determined. Then an output signal is generated which is phase delayed from the input signal by a phase amount. The phase amount is approximately equal to the length of the cycle of the input signal multiplied by the predetermined phase angle.

10 Claims, 7 Drawing Sheets

DIGITAL PHASE SHIFTER

CROSS REFERENCE TO RELATED APPLICATION

This application is a division of application Ser. No. 08/575,766, filed Dec. 20, 1995.

BACKGROUND

The present invention concerns the digital circuit design and pertains particularly to implementation of a digital phase shifter.

Within integrated circuits there are various uses for delay circuits. For example, within an asynchronous random access memory (RAM), it is desirable to generate a write enable pulse which has an enabling edge (rising or falling) which is delayed from the rising edge of the clock pulse. Ideally, a write enable pulse is asserted enough time after a rising clock edge to allow for data and address setup. The write enable pulse also needs to disabled before the next clock rising edge.

In prior art circuits, delay buffers are typically used to delay the clock signal and produce a write enable to RAMs. Alternately, latches may be used to generate the write enable. One problem with solutions which rely upon buffers to provide for propagation delay is that there can be a wide variation in delay through a buffer which is due, for example, to process, voltage and/or temperature variations. When using buffers to generate propagation delay it is necessary for a designer to design circuits very conservatively in order to take into account variation in propagation delay through a buffer.

SUMMARY OF THE INVENTION

In accordance with the preferred embodiment of the present invention, a digital phase shifter phase shifts an input signal by a predetermined phase angle. The digital phase shifter determines the length of a cycle of the input signal. The digital phase shifter generates an output signal which is phase delayed from the input signal by a phase amount. The phase amount is approximately equal to the length of the cycle of the input signal multiplied by the predetermined phase angle.

In one embodiment of the present invention, a plurality of delay elements is connected in series. The input signal propagates through the delay elements. Delay (D) flip-flops, each with a D input connected to an output of a delay element and a clock input connected to the input signal, are used to detect the number of delay elements the input signal propagates through during a full cycle of the input signal. Logic circuitry uses the information stored in the D flip-flops to detect a leading edge of the input signal. Additional logic circuitry then selects a first of the plurality of delay elements to provide an output signal. The output of the first signal is selected based on the predetermined phase angle and the number of delay elements the input signal propagates through during a full cycle of the input signal.

In another embodiment of the present invention, a counter counts a number of cycles of an oscillating signal, generated by a ring oscillator, which occur during a full cycle of the input signal. The count result is stored in a register. Combinational logic generates a leading edge count and a falling edge count. The leading edge count and the falling edge count are based on the predetermined phase angle and the count result stored in the register. Count compare logic generates a rising edge of the output signal when a current count of the counter equals the leading edge count. The count compare logic generates a falling edge of the output signal when the current count of the counter equals the falling edge count.

The digital phase shifter may be used to synchronize the output of a clock tree with a reference clock. In this case, the input signal is the reference clock and the output signal serves as input to the clock tree. The predetermined phase angle is adjusted so that an output of the clock tree is in phase with the reference clock.

Alternately, the digital phase shifter may be used in a frequency multiplier circuit. In this case, logic circuitry, connected to the output signal and the input signal produces a signal which has a frequency which is a multiple of a frequency of the input signal. For example, the logic circuitry is a logic XOR gate.

Additionally the phase delay signal may be used to reliably delay a write enable signal or some other signal which is required to occur some time after a clock edge.

The present invention provides for a digital phase shifter which continues to accurately phase delay signals even when process, voltage and temperature variations may result in varying delay through delay buffers.

DESCRIPTION OF THE PREFERRED EMBODIMENT

Figure 1:
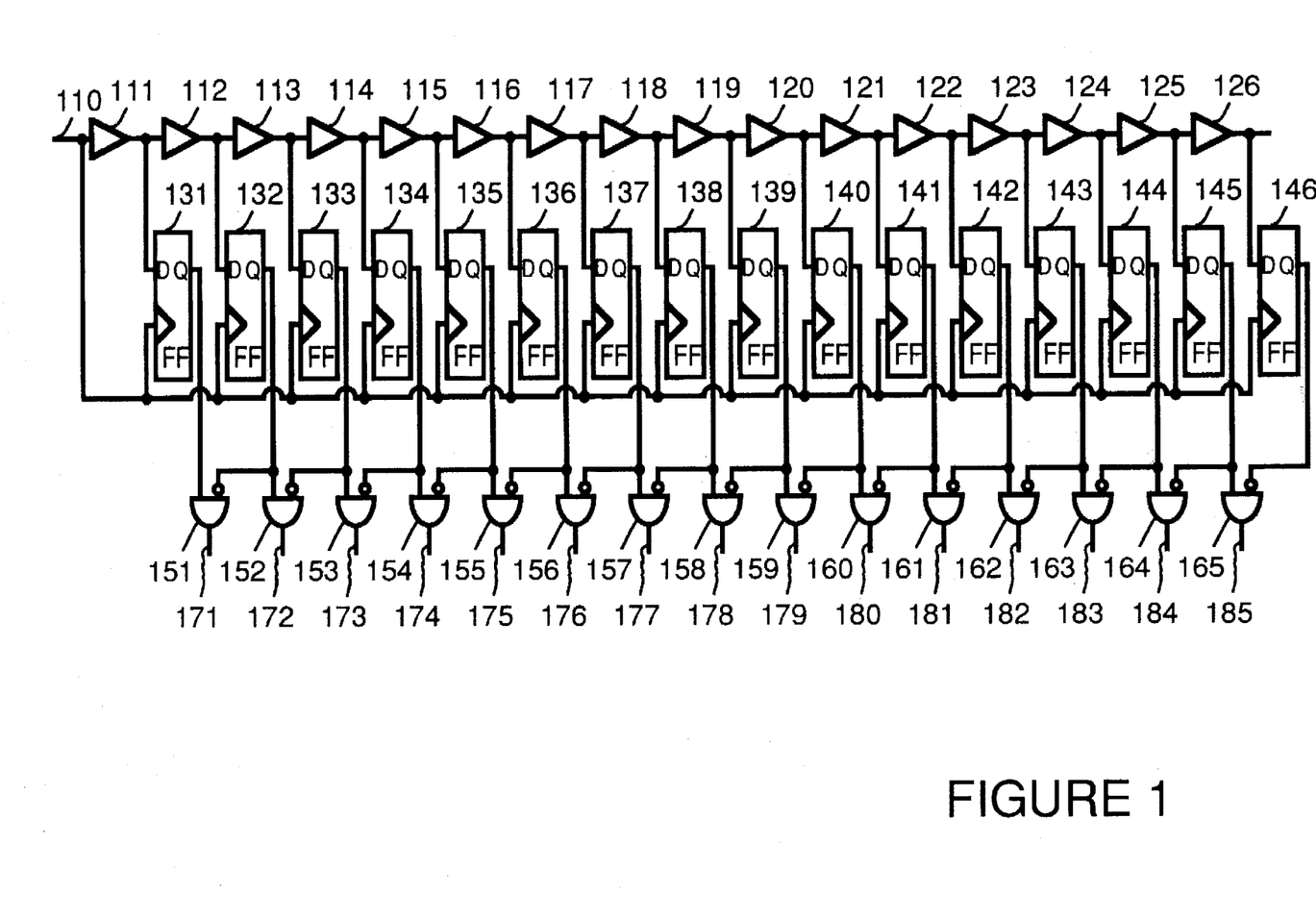
FIG. 1 shows circuitry which detects clock edge transitions in accordance with a preferred embodiment of the present invention.

FIG. 1 shows circuitry which detects clock edge transitions. FIG. 1 is used to illustrate operation of a digital phase shifter which operates in accordance with embodiments of the present invention. Such a digital phase shifter measures the period of an input signal, such as a clock signal, and produces an output signal which is delayed some fraction of the period of the input signal, such that the delay is not subject to process, voltage or temperature variations. Such a digital phase shifter can then be used, for example, to reduce clock latency, for clock frequency multiplication, or to produce a signal delayed a known amount from another signal.

For the embodiment shown in FIG. 1, a series of delay elements 111, 112, 113, 114, 115, 116, 117, 118, 119, 120, 121, 122, 123, 124, 125 and 126 are used to delay an input signal 110. Delay elements 111–126 may be, for example, buffers, RC delay segments of metal, two logic NOT gates coupled in series, etc. While sixteen delay elements are shown, it is clear that the number of delay elements used can vary significantly. For example, to delay a clock with a frequency of 50 megahertz, it would be typical to use up to 100 buffers which each introduce an approximate propagation delay of 400 picoseconds.

As input signal 110 is propagated through delay elements 111–126, the outputs of delay elements 111–126 at any particular time give a "snapshot" of the input signal. In essence, delay (D) flip-flops 131, 132, 133, 134, 135, 136, 137, 138, 139, 140, 141, 142, 143, 144, 145 and 146 record the snapshot upon the beginning of each clock cycle.

For example, suppose time T is the period of an input signal and that each of delay elements 111 through 126 has a propagation of ⅛ T. Then, if the input signal is started at a time 0, table 1 below shows values for the outputs of delay elements (DE) 111–126 and D flip-flops (FF) 131–146 at each of times ¼ T, ½ T, ¾ T and T.

time T. In Table 1, at time T, it is seen that the leading edge of the input signal is at the output of delay element 118, and is capture by flip-flop 138 at time T.

In FIG. 1, logic AND gates 151, 152, 153, 154, 155, 156, 157, 158, 159, 160, 161, 162, 163, 164 and 165 are used to detect the leading edge of the input signal. Each of logic AND gates 151–165 performs a logic NOT on one input, as shown. Each of logic AND gates 151–165 respectively has an output 171, 172, 173, 174, 175, 176, 177, 178, 179, 180, 181, 182, 183, 184 and 185, as shown. Outputs 171 through 185 indicate at which of D flip-flops 131–146 resides the leading edge of the input signal. The leading edge of the clock signal will reside at a leftmost D flip-flop 131–146 which holds a logic one while a D- flip-flop immediately to the right holds a logic 0. The leading edge will be indicated by the leftmost of logic AND gates 151–165 which has a logic 1 on its respective output 171–185.

For the above given example, where time T is the period of an input signal and that each of delay elements 111 through 126 has a propagation of ⅛ T. Table 2 below shows values for the outputs of delay elements (DE) 111–126, the outputs of D flip-flops (FF) 131–146 and the outputs of AND gates 151–165 at each of times T and 2 T.

TABLE 1

| | | | | | | | Time 0 | | | | | | | | |
|---|---|---|---|---|---|---|---|---|---|---|---|---|---|---|---|
| DE # | 111 | 112 | 113 | 114 | 115 | 116 | 117 | 118 | 119 | 120 | 121 | 122 | 123 | 124 | 125 | 126 |
| DE Output | 0 | 0 | 0 | 0 | 0 | 0 | 0 | 0 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 0 | 0 | 0 | 0 | 0 | 0 | 0 | 0 | 0 | 0 | 0 | 0 |

| | | | | | | | Time 1/4 T | | | | | | | | |
|---|---|---|---|---|---|---|---|---|---|---|---|---|---|---|---|
| DE # | 111 | 112 | 113 | 114 | 115 | 116 | 117 | 118 | 119 | 120 | 121 | 122 | 123 | 124 | 125 | 126 |
| DE Output | 1 | 1 | 0 | 0 | 0 | 0 | 0 | 0 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 0 | 0 | 0 | 0 | 0 | 0 | 0 | 0 | 0 | 0 | 0 | 0 |

| | | | | | | | Time 1/2 T | | | | | | | | |
|---|---|---|---|---|---|---|---|---|---|---|---|---|---|---|---|
| DE # | 111 | 112 | 113 | 114 | 115 | 116 | 117 | 118 | 119 | 120 | 121 | 122 | 123 | 124 | 125 | 126 |
| DE Output | 1 | 1 | 1 | 1 | 0 | 0 | 0 | 0 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 0 | 0 | 0 | 0 | 0 | 0 | 0 | 0 | 0 | 0 | 0 | 0 |

| | | | | | | | Time 3/4 T | | | | | | | | |
|---|---|---|---|---|---|---|---|---|---|---|---|---|---|---|---|
| DE # | 111 | 112 | 113 | 114 | 115 | 116 | 117 | 118 | 119 | 120 | 121 | 122 | 123 | 124 | 125 | 126 |
| DE Output | 0 | 0 | 1 | 1 | 1 | 1 | 0 | 0 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 0 | 0 | 0 | 0 | 0 | 0 | 0 | 0 | 0 | 0 | 0 | 0 |

| | | | | | | | Time T | | | | | | | | |
|---|---|---|---|---|---|---|---|---|---|---|---|---|---|---|---|
| DE # | 111 | 112 | 113 | 114 | 115 | 116 | 117 | 118 | 119 | 120 | 121 | 122 | 123 | 124 | 125 | 126 |
| DE Output | 0 | 0 | 0 | 0 | 1 | 1 | 1 | 1 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 1 | 1 | 1 | 1 | 0 | 0 | 0 | 0 | 0 | 0 | 0 | 0 |

Note that at times ¼ T, ½ T, and ¾ T, each of D flip-flops 131–146 all have output values of logic 0. This is because until time T, no value gets clocked into any of D flip-flops 131–146. At time T, the current values on the outputs of delay elements 111 through 126 get clocked into D flip-flops 131–146, respectively.

The information stored in D flip-flops 131–146 may be used to determine the relative propagation delay through each of delay elements 111–126. This is done by detecting through how many delay elements the leading edge of the clock signal has propagated through during a signal cycle

TABLE 2

Time T

| DE # | 111 | 112 | 113 | 114 | 115 | 116 | 117 | 118 | 119 | 120 | 121 | 122 | 123 | 124 | 125 | 126 |
|---|---|---|---|---|---|---|---|---|---|---|---|---|---|---|---|---|
| DE Output | 0 | 0 | 0 | 0 | 1 | 1 | 1 | 1 | 0 | 0 | 0 | 0 | 0 | 0 | 0 | 0 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 1 | 1 | 1 | 1 | 0 | 0 | 0 | 0 | 0 | 0 | 0 | 0 |
| Output # | 171 | 172 | 173 | 174 | 175 | 176 | 177 | 178 | 179 | 180 | 181 | 182 | 183 | 184 | 185 | |
| Output | 0 | 0 | 0 | 0 | 0 | 0 | 0 | 1 | 0 | 0 | 0 | 0 | 0 | 0 | 0 | |

Time 2T

| DE # | 111 | 112 | 113 | 114 | 115 | 116 | 117 | 118 | 119 | 120 | 121 | 122 | 123 | 124 | 125 | 126 |
|---|---|---|---|---|---|---|---|---|---|---|---|---|---|---|---|---|
| DE Output | 0 | 0 | 0 | 0 | 1 | 1 | 1 | 1 | 0 | 0 | 0 | 0 | 1 | 1 | 1 | 1 |
| FF # | 131 | 132 | 133 | 134 | 135 | 136 | 137 | 138 | 139 | 140 | 141 | 142 | 143 | 144 | 145 | 146 |
| FF Output | 0 | 0 | 0 | 0 | 1 | 1 | 1 | 1 | 0 | 0 | 0 | 0 | 1 | 1 | 1 | 1 |
| Output # | 171 | 172 | 173 | 174 | 175 | 176 | 177 | 178 | 179 | 180 | 181 | 182 | 183 | 184 | 185 | |
| Output | 0 | 0 | 0 | 0 | 0 | 0 | 0 | 1 | 0 | 0 | 0 | 0 | 0 | 0 | 0 | |

Output 171–185 of logic AND gates 151–165 continue to indicate the number of delay elements 111 through 126 which are traversed in a single cycle of input signal 110 even when temperature, process, voltage or other factors varies the propagation delay through buffers 111 through 126.

For the above given example, where time T is the period of an input signal and that each of delay elements 111 through 126 has a propagation of ¼ T, Table 3 below shows values for the outputs of D flip-flops (FF) 131–146 and the outputs of AND gates 151–165 at each of times T and 2 T.

TABLE 3

Time T

| FF # | 131 | 132 | 133 | 134 | 135 | 136 | 137 | 138 | 139 | 140 | 141 | 142 | 143 | 144 | 145 | 146 |
|---|---|---|---|---|---|---|---|---|---|---|---|---|---|---|---|---|
| FF Output | 0 | 0 | 1 | 1 | 0 | 0 | 0 | 0 | 0 | 0 | 0 | 0 | 0 | 0 | 0 | 0 |
| Output # | 171 | 172 | 173 | 174 | 175 | 176 | 177 | 178 | 179 | 180 | 181 | 182 | 183 | 184 | 185 | |
| Output | 0 | 0 | 0 | 1 | 0 | 0 | 0 | 0 | 0 | 0 | 0 | 0 | 0 | 0 | 0 | |

Time 2T

| FF # | 131 | 132 | 133 | 134 | 135 | 136 | 137 | 138 | 139 | 140 | 141 | 142 | 143 | 144 | 145 | 146 |
|---|---|---|---|---|---|---|---|---|---|---|---|---|---|---|---|---|
| FF Output | 0 | 0 | 1 | 1 | 0 | 0 | 1 | 1 | 0 | 0 | 0 | 0 | 1 | 1 | 1 | 1 |
| Output # | 171 | 172 | 173 | 174 | 175 | 176 | 177 | 178 | 179 | 180 | 181 | 182 | 183 | 184 | 185 | |
| Output | 0 | 0 | 0 | 1 | 0 | 0 | 0 | 1 | 0 | 0 | 0 | 0 | 0 | 0 | 0 | |

As may be understood from Table 3, above, the values of output 171–185 of logic AND gates 151–165 indicate that the number of delay elements 111 through 126 which are traversed in a single cycle of input signal 110 is equal to four, as indicated by the leftmost of logic AND gates 151–165 which has a logic 1.

Since the circuit shown in FIG. 1 is able to detect the number of delay elements which are traversed in a single cycle of an input signal, it is possible to design a circuit which utilizes this information to generate a phase delayed output signal.

Figure 2:
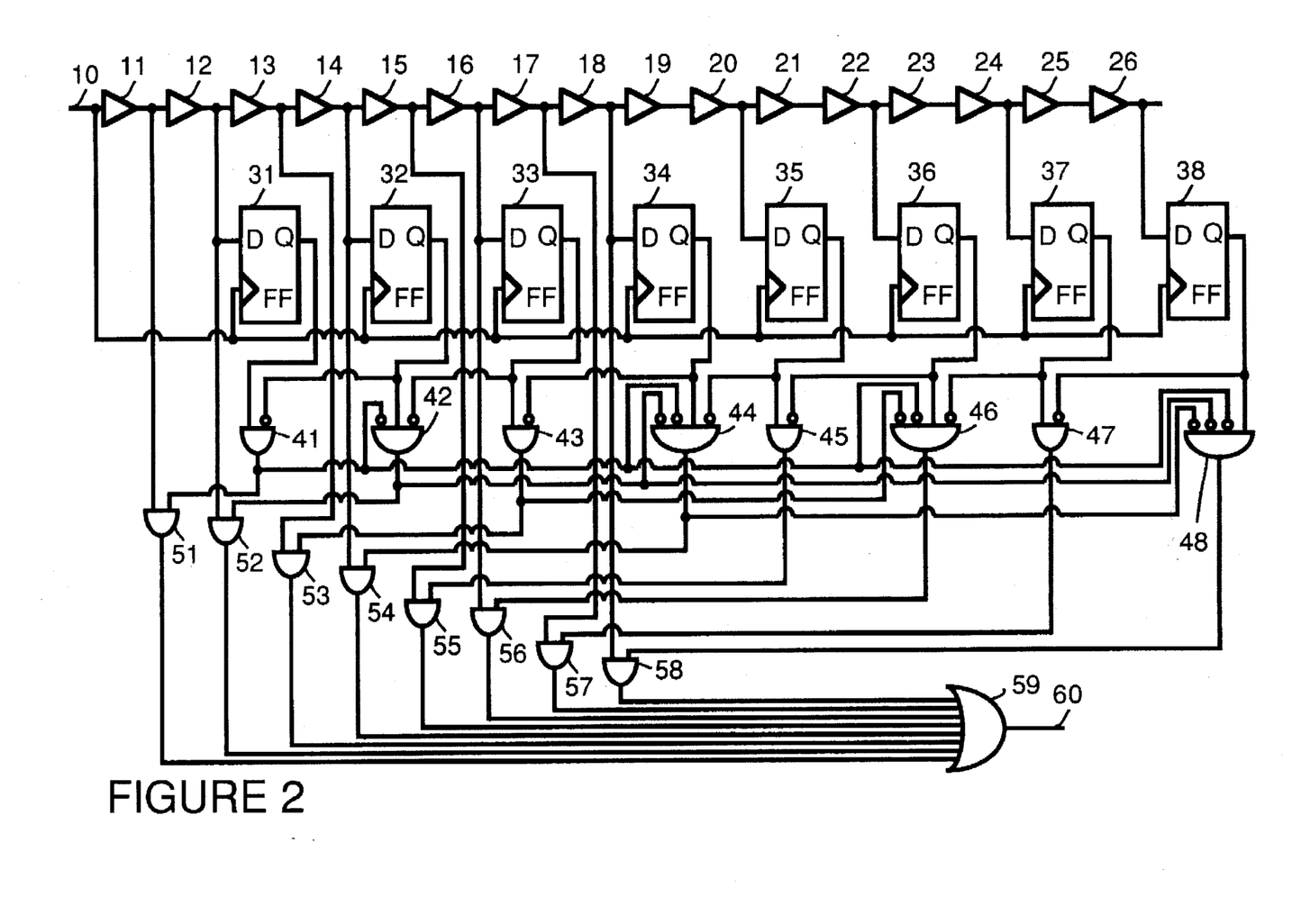
FIG. 2 shows circuitry which performs a 180 degree phase shift of a signal in accordance with a preferred embodiment of the present invention.

For example, FIG. 2 shows a circuit which performs a 180 degree phase delay of an input signal 10 to produce an output signal 60. In the circuit shown in FIG. 2, a series of delay elements 11, 12, 13, 14, 15, 16, 17, 18, 19, 20, 21, 22, 23, 24, 25 and 26 are used to delay an input signal 10. Delay elements 11–26 may be, for example, buffers or RC delay segments of metal. While sixteen delay elements are shown, it is clear that the number of delay elements used can vary significantly.

As input signal 10 is propagated through delay elements 11–26, the outputs of delay elements 11–26 at any particular time give a "snapshot" of the input signal. In essence, delay (D) flip-flops 31, 32, 33, 34, 35, 36, 37 and 38 record the snapshot upon the beginning of each clock cycle.

In FIG. 2, logic AND gates 41, 42, 43, 44, 45, 46, 47 and 48 are used to detect the leading edge of the input signal. Extra inputs are added to logic AND gates 42, 44, 46 and 48 so that only the leftmost leading edge of the input signal is used to generate the output signal 60. Logic AND gates 51, 52, 53, 54, 55, 56, 57 and 58, and logic OR gate 59 utilize the output of logic AND gates 41 through 48 to produce output signal 60.

In essence, for the circuit of FIG. 2, flip-flops 31–38 and logic AND gates 41 through 48 detect the number of delay elements which are traversed in a single cycle of an input signal. Using this information, logic AND gates 51 through 58 and logic OR gate 59 isolate a signal from the output of one of the delay elements 11 through 26 to produce output signal 60. In FIG. 2, output signal 60 is phase delayed 180 degrees. However, using the teaching of the present invention, it is possible to phase delay an output signal by any amount.

Figure 3:
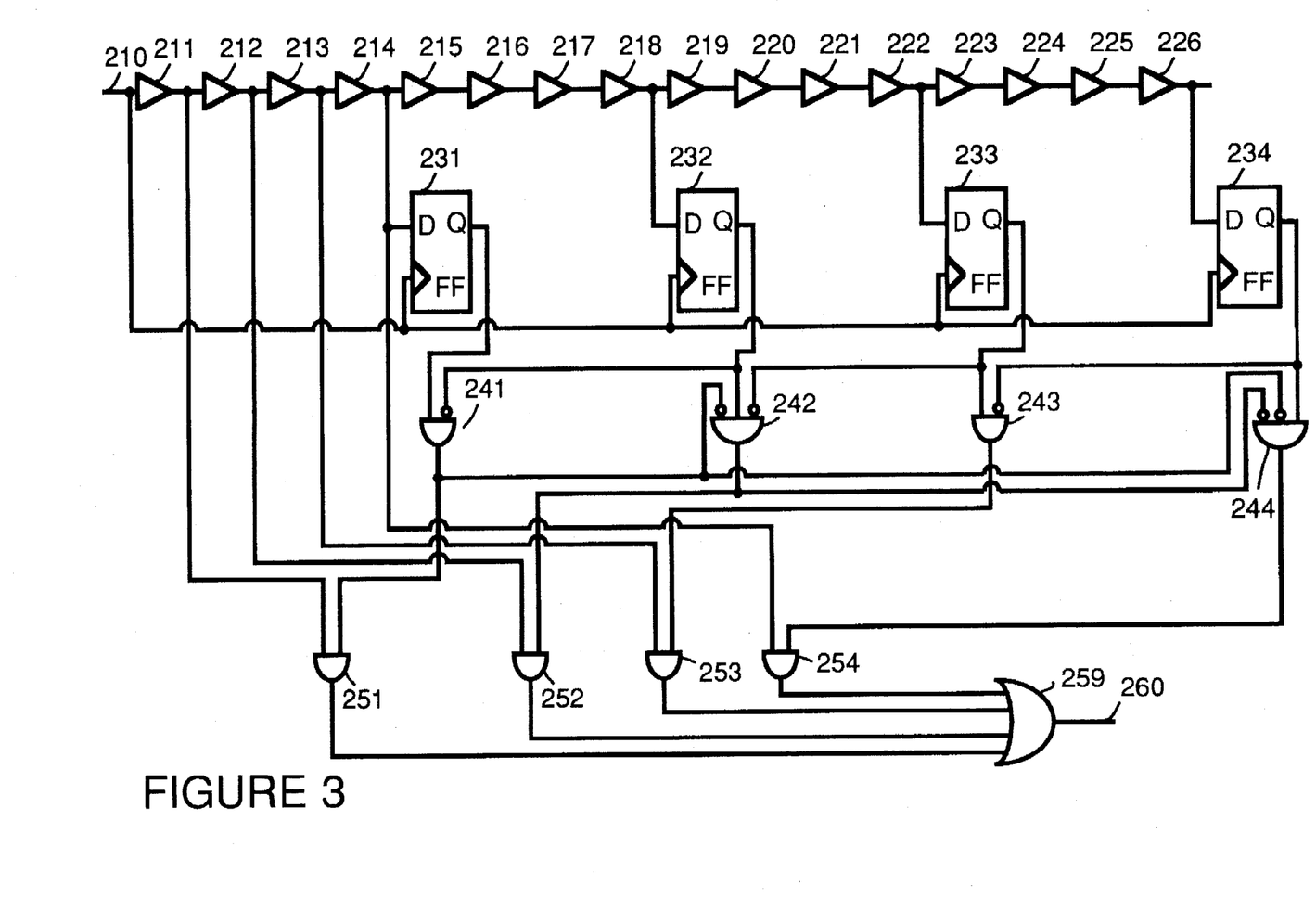
FIG. 3 is a block diagram of circuitry which performs a 90 degree phase shift of a signal in accordance with an alternate preferred embodiment of the present invention.

For example, FIG. 3 shows a circuit which performs a 90 degree phase delay of an input signal 210 to produce an output signal 260. In the circuit shown in FIG. 3, a series of delay elements 211, 212, 213, 214, 215, 216, 217, 218, 219, 220, 221, 222, 223, 224, 225 and 226 are used to delay an input signal 10. Delay elements 211–226 may be, for example, buffers or RC delay segments of metal. While sixteen delay elements are shown, it is clear that the number of delay elements used can vary significantly.

As input signal 210 is propagated through delay elements 211–226, the outputs of delay elements 211–226 at any particular time give a "snapshot" of the input signal. In essence, delay (D) flip-flops 231, 232, 233 and 234 record the snapshot upon the beginning of each clock cycle. Since the purpose of the circuit in FIG. 3 is to perform a 90 degree phase shift, delay (D) flip-flops which are not necessary for this purpose are not included.

In FIG. 3, logic AND gates 241, 242, 243 and 244 are used to detect the leading edge of the input signal. Extra inputs are added to logic AND gates 242, and 244 so that only the leftmost leading edge of the input signal is used to generate the output signal 60. Logic AND gates 251, 252, 253 and 254, and logic OR gate 259 utilize the output of logic AND gates 241 through 244 to produce output signal 260.

In essence, for the circuit of FIG. 3, flip-flops 231 through 234 and logic AND gates 241 through 244 detect the number of delay elements which are traversed in a single cycle of an input signal. Using this information, is logic AND gates 251 through 254 and logic OR gate 259 isolate a signal from the output of one of the delay elements 11 through 26 to produce output signal 620. In FIG. 3, output signal 60 is phase delayed 90 degrees.

Figure 4:
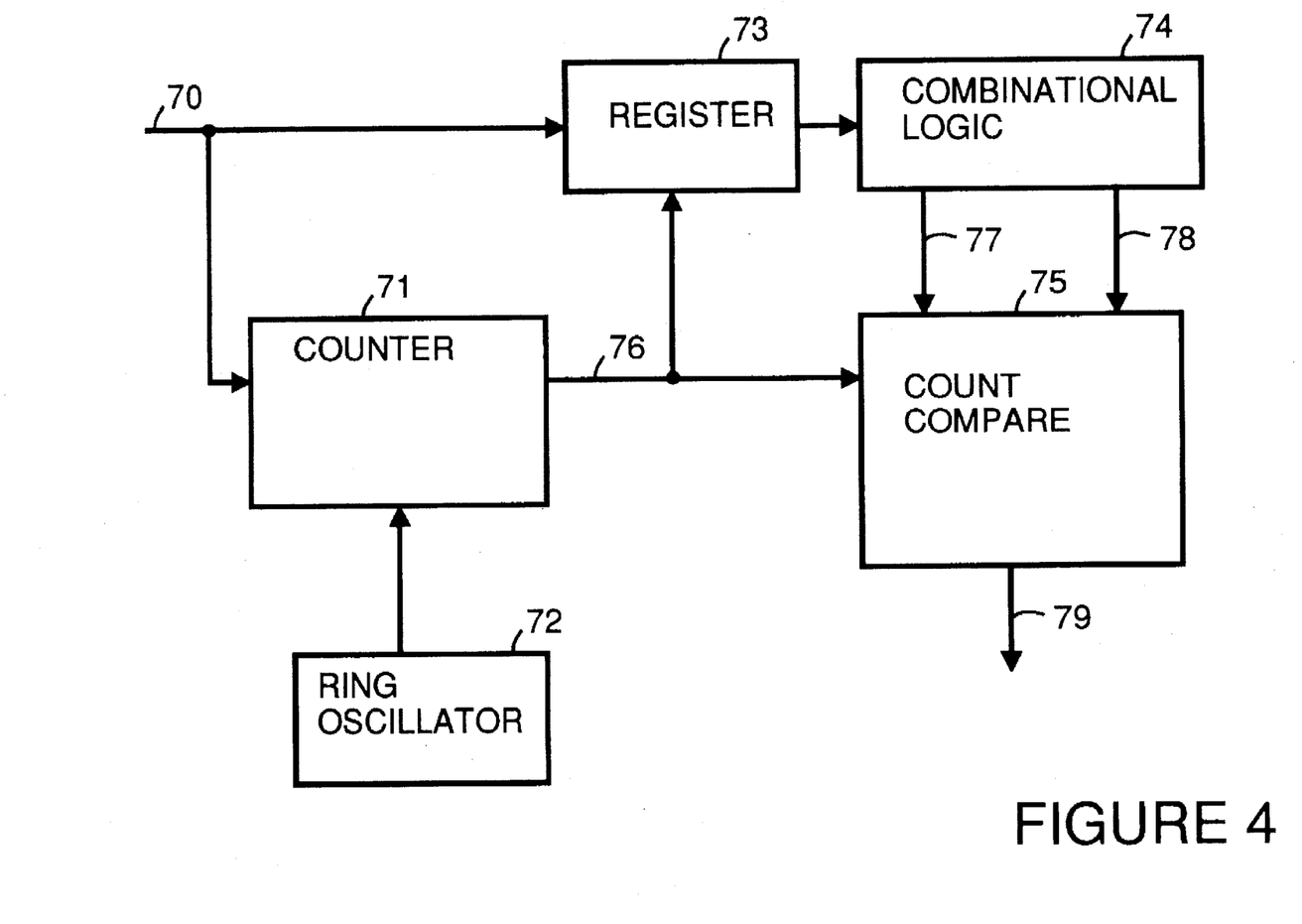
FIG. 4 is a block diagram of circuitry which performs a phase shift in accordance with another alternate preferred embodiment of the present invention.

The principles of the present invention may be adapted into other embodiments. For example, FIG. 4, shows the period of an input signal 70 may be detected using a counter 71, a ring oscillator 72 and a register 73. Ring oscillator 72 is, for example, an odd number of logic NAND gates connected together as a ring. Ring oscillator 72 is connected to a serial count input of counter 71. Input signal 70 is connected to a reset input of counter 71. Upon being reset by input signal 70, counter 71 begins counting oscillations of ring oscillator 72. The count is placed on an output 76 of counter 72. Upon completion of a full cycle of input signal 70, register 73 captures the count on counter output 76. In this way, register 73 always holds a number which represents the current duration of the cycle of input signal 70.

Combinational logic 74 divides the count in register 73 to produce a trigger high count 77 and a trigger low count 78. For example, when it is desirable to generate a signal which is 90 degrees out of phase, combination logic 74 will multiply the count in register 73 by one-fourth to produce trigger high count 77 and will multiply the count in register 73 by three-fourths to produce trigger low count 78. Similarly when it is desirable to generate a signal which is 300 degrees out of phase, combination logic 74 will multiply the count in register 73 by five-sixths to produce trigger high count 77 and will multiply the count in register 73 by one sixth to produce trigger low count 78. And so on.

Count compare logic 75 compares the count on counter output 76 with trigger high count 77 and trigger low count 78. When the count on counter output 76 equals trigger high count 77, count compare logic 75 drives an output signal 79 high. When the count on counter output 76 equals trigger low count 78, count compare logic 75 drives output signal 79 low.

While, in the examples given above, output signal 79 is generated with a 50% duty cycle, it is also possible to vary the pulse width of output signal 79 by appropriately selecting values of trigger low count 78. To lengthen the pulse width of output signal 79, counts are added to trigger low count 78. To shorten the pulse width, counts are subtracted from trigger low count 78.

Figure 5:
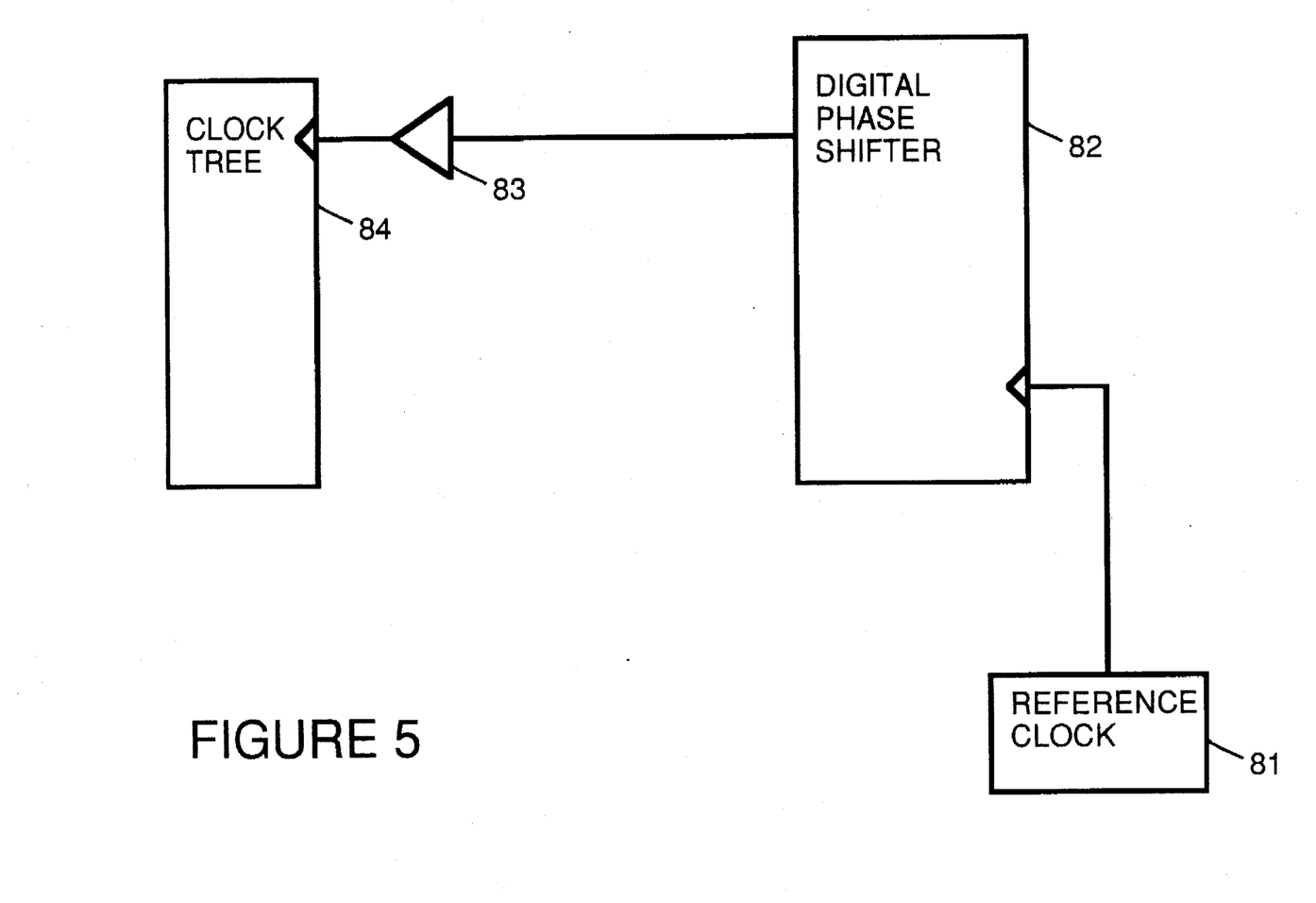
FIG. 5 is a block diagram of circuitry which demonstrates use of a digitally controlled phase shifter to provide a signal to a clock tree in accordance with a preferred embodiment of the present invention.

A digital phase shifter, as described above, may variously be used in VLSI circuitry. For example, FIG. 5 shows a digital phase shifter 82 used to phase delay a reference clock signal 81 in order to generate a signal to drive a clock tree 84. An amplifier 83 amplifies the output signal of digital phase shifter 82 before forwarding the output signal to clock tree 84. In alternate embodiments of the present invention, a feedback loop is used to provide feedback to digital phase shifter 82. In response to the feedback loop, digital phase shifter 82 increases or decreases the length of the phase shift. In this way, clock signals generated by clock tree 84 may be kept in phase with reference clock 81.

Figure 6:
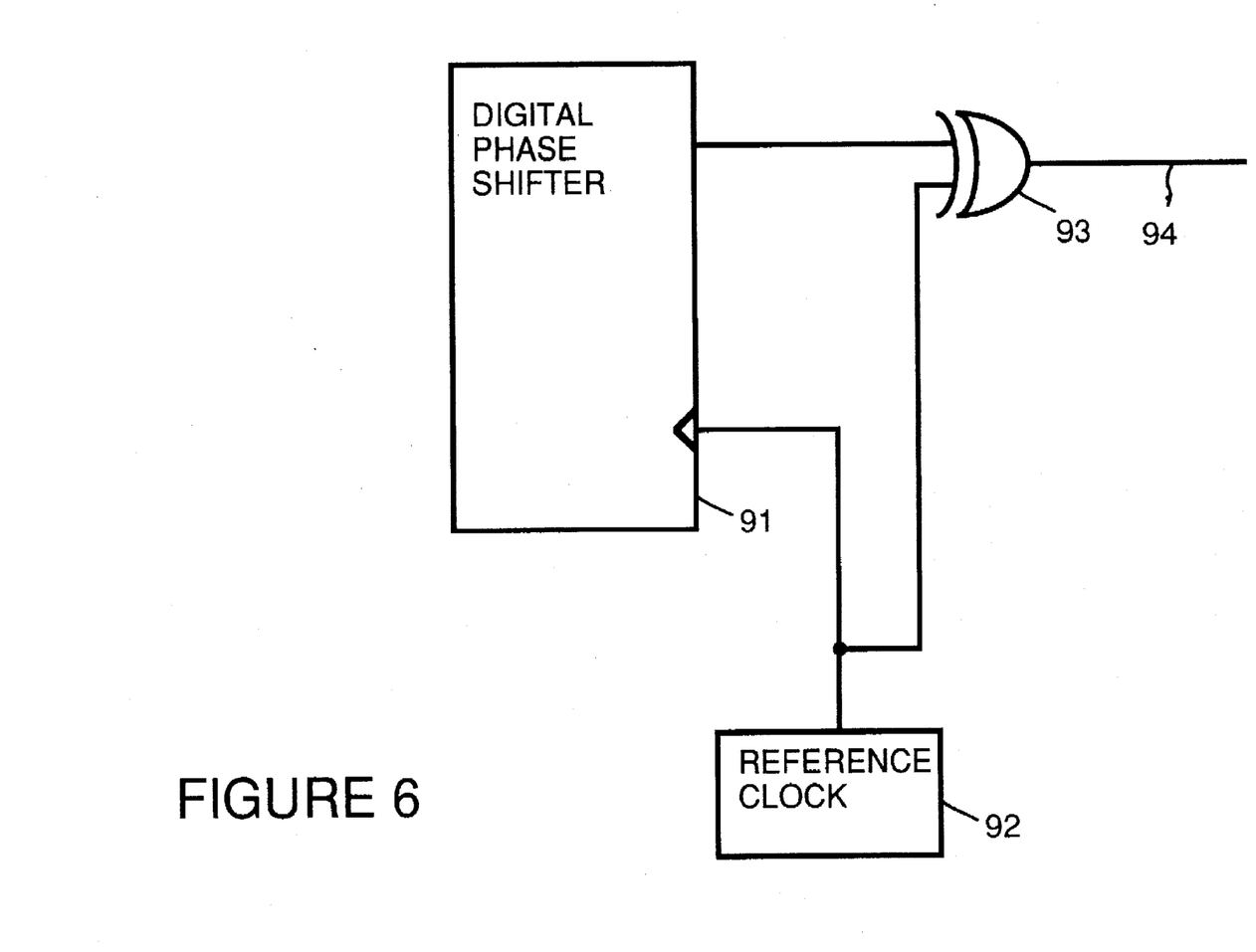
FIG. 6 is a block diagram of circuitry which demonstrates use of a digitally controlled phase shifter in a frequency multiplier in accordance with a preferred embodiment of the present invention.

FIG. 6 shows a digital phase shifter 91 used in a frequency multiplier circuit. Digital phase shifter 92 phase shifts a reference clock 90 degrees. A logic XOR uses the phase shifted signal from digital phase shifter 91 and the reference clock 92 to produce a signal 94 which has a frequency twice that of reference clock 92.

Figure 7:
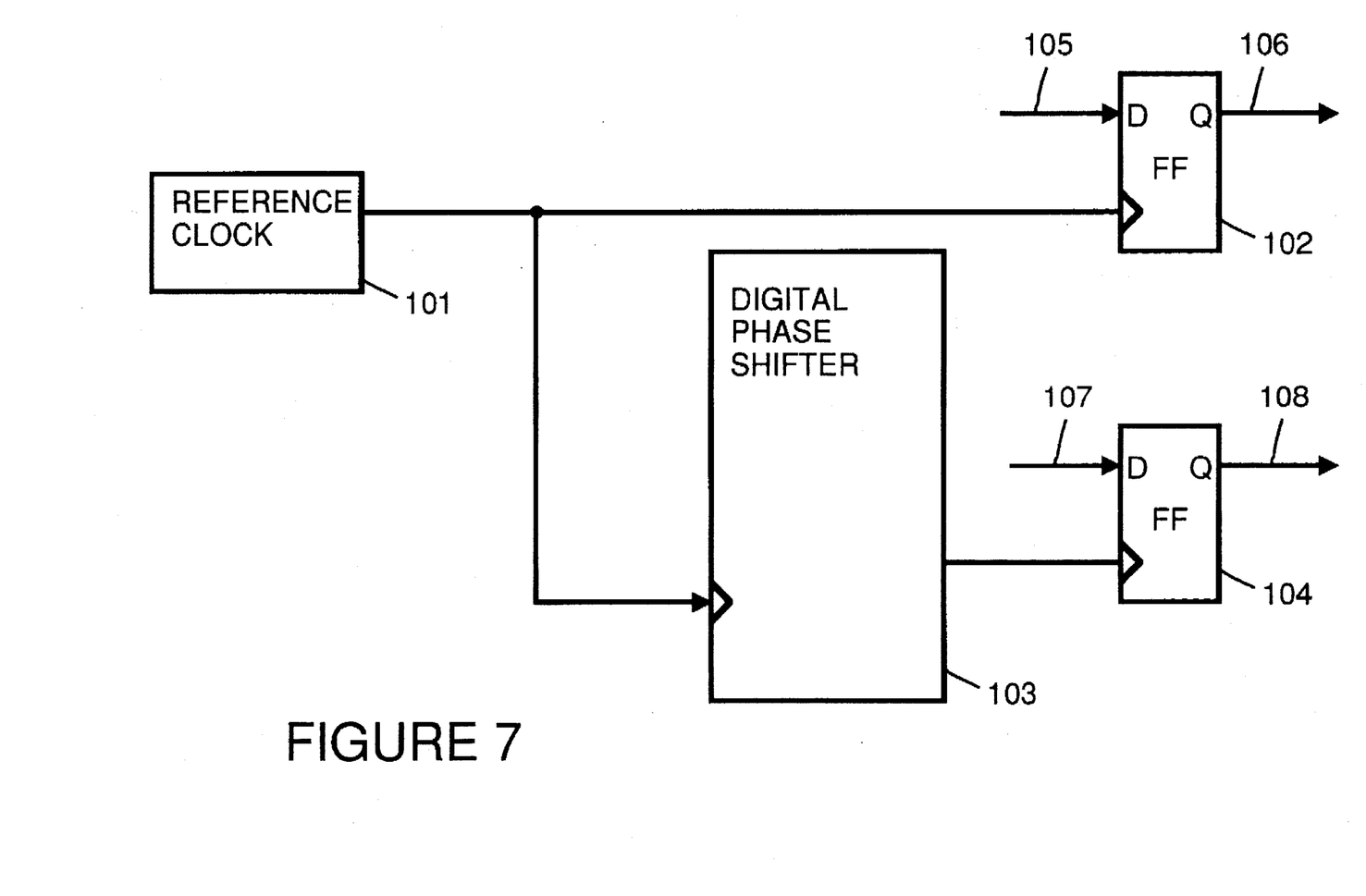
FIG. 7 is a block diagram of circuitry which demonstrates use of a digitally controlled phase shifter to produce a delayed clock signal in accordance with a preferred embodiment of the present invention.

FIG. 7 shows a digital phase shifter 103 used to delay a reference clock 101 for use with a D flip-flop 107 which receives late arriving data 107 to produce an output 108. For normally arriving data 105, a D flip-flop 102 uses reference clock 101 to generate an output 106.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A digital phase shifter which phase shifts an input signal by a predetermined phase angle, the digital phase shifter comprising:

a cycle length detection means, coupled to the input signal, for determining a length of a cycle of the input signal, the cycle length detection means including a counter which initializes a count at a beginning of each cycle of the input signal; and, an output signal generation means, coupled to the cycle length detection means, for generating an output signal which is phase delayed from the input signal by a phase amount, the phase amount being approximately equal to the length of the cycle of the input signal multiplied by the predetermined phase angle, wherein the output signal generation means comprises:

combinational logic, coupled to the cycle length detection means having a first output and a second output, the combinational logic generating a leading edge count on the first output and a falling edge count on the second output the leading edge count and the falling edge count being based on the predetermined phase angle and the length of the cycle detected by the cycle length detection means, and count compare logic, coupled to the cycle length detection means and the combinational logic for generating a rising edge of the output signal when a current count of the counter equals the leading edge count and for generating a falling edge of the output signal when the current count of the counter equals the falling edge count.

2. A digital phase shifter as in claim 1 wherein the cycle length detection means comprises:

a register; and, a ring oscillator which generates an oscillating signal; wherein the counter is coupled to the ring oscillator, the register and the input signal, and is for counting a number of cycles of the oscillating signal which occur during a full cycle of the input signal and storing a count result in the register.

3. A digital phase shifter as in claim 1 wherein:

the input signal is a reference clock;

the output signal serves as input to a clock tree; and, the predetermined phase angle is adjusted so that an output of the clock tree is in phase with the reference clock.

4. A digital phase shifter as in claim 1 wherein:

the input signal is a reference clock; and logic circuitry, coupled to the output signal and the reference clock, produces a signal which has a frequency which is a multiple of a frequency of the reference clock.

5. A digital phase shifter as in claim 4 wherein the logic circuitry is a logic XOR gate.

6. A digital phase shifter as in claim 1 wherein:

the input signal is a reference clock; and, the output signal serves as phase delayed clock signal.

7. A method for phase shifting an input signal by a predetermined phase angle, method comprising the steps of:

(a) determining a length of a cycle of the input signal, wherein step (a) includes the following substeps:

(a.1) counting, with a counter a number of cycles of an oscillating signal which occur during a cycle of the input signal; and (a.2) storing a count result; and, (b) generating an output signal which is phase delayed from the input signal by a phase amount, the phase amount being approximately equal to the length of the cycle of the input signal multiplied by the predetermined phase angle, wherein step (b) includes the following substeps:

(b.1) generating a leading edge count on a first combinational logic output, the leading edge count being based on the predetermined phase angle and the count result, (b.2) generating a falling edge count on a second combinational logic output, the falling edge count being based on the predetermined phase angle and the count result.

(b.3) generating a rising edge of the output signal when a current count of the counter equals the leading edge count, and (b.4) generating a falling edge of the output signal when the current count of the counter equals the falling edge count.

8. A method as in claim 7 wherein the input signal is a reference clock, the output signal serves as input to a clock tree, and the method additionally includes the following step:

(c) adjusting the predetermined phase angle so that an output of the clock tree is in phase with the reference clock.

9. A method as in claim 7 wherein the input signal is a reference clock and the method additionally includes the following step:

using logic circuitry to produces a signal which has a frequency which is a multiple of a frequency of the reference clock.

10. A method as in claim 7 wherein the input signal is a reference clock and the method additionally includes the following step:

(c) using the output signal as a phase delayed clock signal.

* * * * *